US010020055B2

(12) United States Patent
Suzuki et al.

(10) Patent No.: US 10,020,055 B2
(45) Date of Patent: Jul. 10, 2018

(54) SEMICONDUCTOR MEMORY DEVICE

(71) Applicant: TOSHIBA MEMORY CORPORATION, Minato-ku, Tokyo (JP)

(72) Inventors: Kunifumi Suzuki, Mie (JP); Kazuhiko Yamamoto, Mie (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 15/830,311

(22) Filed: Dec. 4, 2017

(65) Prior Publication Data
US 2018/0130529 A1 May 10, 2018

Related U.S. Application Data

(63) Continuation of application No. 15/269,506, filed on Sep. 19, 2016, now Pat. No. 9,859,002.

(60) Provisional application No. 62/309,676, filed on Mar. 17, 2016.

(51) Int. Cl.
G11C 13/00 (2006.01)

(52) U.S. Cl.
CPC ...... *G11C 13/0069* (2013.01); *G11C 13/0064* (2013.01); *G11C 13/0004* (2013.01); *G11C 13/0007* (2013.01)

(58) Field of Classification Search
CPC ............ G11C 13/0069; G11C 13/0004; G11C 13/0007

USPC ........................................................ 365/148
See application file for complete search history.

(56) References Cited

U.S. PATENT DOCUMENTS 8,199,576 B2    6/2012  Fasoli et al.
8,822,966 B2    9/2014  Takahashi et al.
2012/0300532 A1* 11/2012 Yamazaki ............... H01L 45/08
                                                      365/148

FOREIGN PATENT DOCUMENTS

JP     2013-200930 A    10/2013

OTHER PUBLICATIONS

U.S. Notice of Allowance on U.S. Appl. No. 15/269,506 dated Aug. 30, 2017.

* cited by examiner

Primary Examiner — Jason Lappas
(74) Attorney, Agent, or Firm — Foley & Lardner LLP

(57) ABSTRACT

According to embodiments, a semiconductor memory device includes a first electrode, a second electrode, a memory cell, and a control circuit. The memory cell is provided between the first electrode and the second electrode and includes a metal film and a resistance change film. The control circuit applies a voltage between the first electrode and the second electrode to perform transition of a resistive state of the memory cell. The control circuit performs a first writing operation by applying a first pulse having a voltage of a first polarity to the memory cell and applying a second pulse having a voltage of the first polarity smaller than the voltage of the first pulse to the memory cell continuously after applying the first pulse.

18 Claims, 12 Drawing Sheets

SEMICONDUCTOR MEMORY DEVICE

CROSS-REFERENCE TO RELATED APPLICATIONS

This application claims benefit and priority under 35 U.S.C. § 120 to U.S. patent application Ser. No. 15/269,506 filed on Sep. 19, 2016 entitled "Semiconductor Memory Device", which claims the benefit of U.S. Provisional Patent Application No. 62/309,676, filed on Mar. 17, 2016, the entire contents of which are incorporated herein by reference.

BACKGROUND

Field

Embodiments described herein relate generally to a semiconductor memory device.

Description of the Related Art

As a semiconductor memory device that stores large capacity data for uses, attention has been focused on such as a resistive random access memory (ReRAM: Resistive RAM) that is easily formed three-dimensionally. As such resistive random access memory, CBRAM (Conduction Bridge RAM), for example, is used.

DETAILED DESCRIPTION

A semiconductor memory device according to one embodiment includes a first electrode, a second electrode, a memory cell, and a control circuit. The memory cell is provided between the first electrode and the second electrode, and includes a metal film and a resistance change film. The control circuit applies a voltage between the first electrode and the second electrode to perform transition of a resistive state of the memory cell. The control circuit performs a first writing operation by applying a first pulse to the memory cell and applying a second pulse to the memory cell continuously after applying the first pulse. The first pulse has a voltage of a first polarity. The second pulse has a voltage of the first polarity smaller than the voltage of the first pulse.

Next, a description will be given of the semiconductor memory device according to the embodiments in detail with reference to the drawings. Here, these embodiments are only examples, and are not described for the purpose of limiting the present invention.

For example, the drawings used in the following embodiments are schematically illustrated. The thickness, the width, and the ratio of the layer, and the magnitude, the application time, and the ratio of the voltage, or similar parameter may be different from actual parameters.

In the following description, as a structure of a memory cell array, a configuration including one layer of memory mat is indicated as an example. However, the present invention may be applicable to a configuration including two or more laminated layers of memory mats. The present invention may also be applicable to a configuration with a bit line extending to a direction intersecting with a surface of a substrate, which is so-called VBL (Vertical Bit Line) type.

In the following description, when a certain voltage is larger (smaller) than another voltage, it means that an amplitude of the certain voltage is larger (smaller) than an amplitude of the other voltage. And when a certain voltage is higher (lower) than another voltage, it means that the certain voltage is higher voltage (lower voltage) than the other voltage. For example, the voltage with −1 V is smaller than the voltage with −2 V, and higher than the voltage with −2 V.

First Embodiment

[Overall Configuration]

Figure 1:
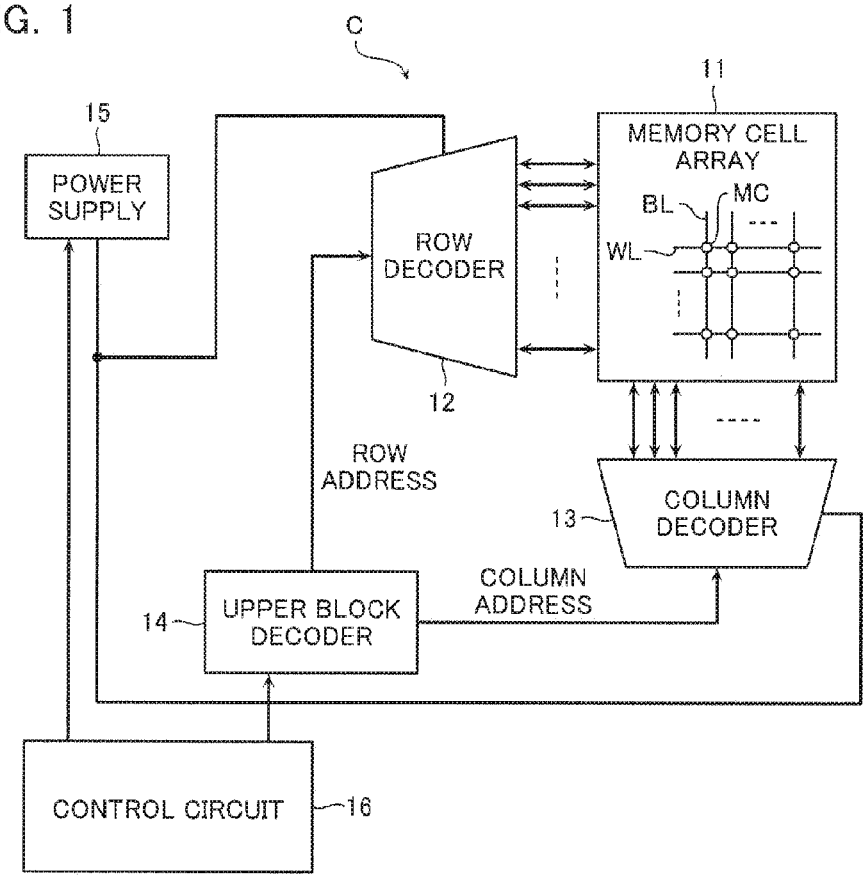
FIG. 1 is a block diagram of a semiconductor memory device according to a first embodiment.

FIG. 1 is a block diagram of a semiconductor memory device according to a first embodiment. Here, the semiconductor memory device means, for example, a chip C that stores user data, an electronic device that includes the chip C (such as a smart phone, a mobile phone, a tablet terminal, a music player, a wearable device), or the like. The user data is data to express, for example, contents used by a user (such as a character string, an audio, an image and a moving image), which are expressed by combinations of "0" and "1."

The chip C includes a memory cell array 11, a row decoder 12, a column decoder 13, an upper block decoder 14, a power supply 15, and a control circuit 16.

The memory cell array 11 includes a plurality of memory cells MC that store data of 1 bit or a plurality of bits.

The memory cell array 11 is configured such that an access (data erasure/writing/reading) to a desired memory cell MC can be performed by applying a predetermined voltage to desired bit line BL and word line WL corresponding to address data.

The row decoder 12 selects one word line WL corresponding to a row address for access to apply the predetermined voltage.

The column decoder 13 selects one or a plurality of bit lines BL corresponding to a column address for access to apply a predetermined voltage. The column decoder 13 includes a sense amplifier circuit for detecting the current or the voltage of the bit line BL to determine the user data recorded on the memory cell MC.

The upper block decoder 14 generates the row address and the column address corresponding to the address data to supply to the row decoder 12 and the column decoder 13.

The power supply 15 generates combinations of the predetermined voltages corresponding to each operation of data erasure/writing/reading to supply to the row decoder 12 and the column decoder 13.

The control circuit 16 accepts external control signals from an external host (not illustrated) to control such as the upper block decoder 14 and the power supply 15.

Figure 2:
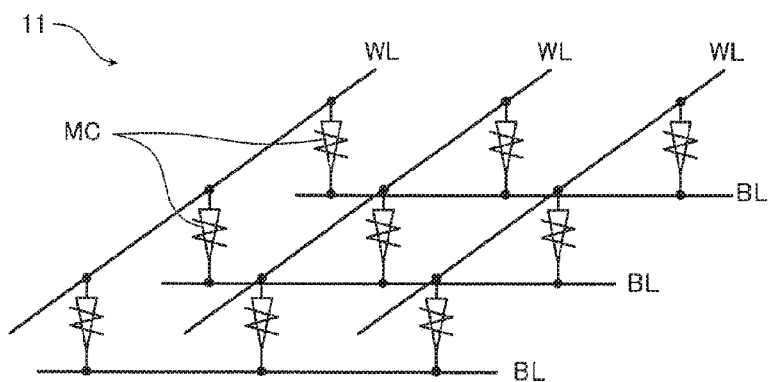
FIG. 2 is a circuit diagram illustrating a configuration of a memory cell array of the semiconductor memory device.

FIG. 2 is an equivalent circuit diagram illustrating a configuration of a part of the memory cell array 11.

The memory cell array 11 includes a plurality of bit lines BL (second wiring), a plurality of word lines WL (first wiring), and a plurality of memory cells MC connected to these bit lines BL and word lines WL. These memory cells MC are connected to the column decoder 13 (FIG. 1) via the bit line BL and to the row decoder 12 (FIG. 1) via the word line WL. The plurality of memory cells MC connected to the common word line WL store user data of one page, for example. The plurality of memory cells MC each store data of one bit, for example.

The memory cell MC serves as a variable resistive element to vary its resistance value corresponding to the stored data. For example, the memory cell MC that records "0" is in a high resistance state, and the memory cell MC that records "1" is in a low resistance state.

Figure 3:
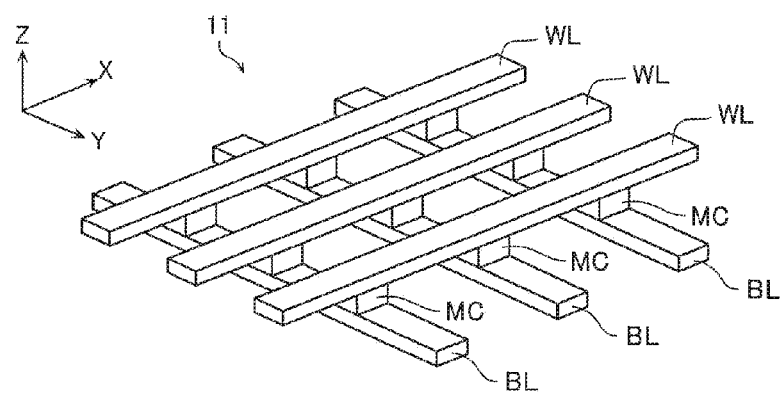
FIG. 3 is a perspective view illustrating the configuration of the memory cell array.

FIG. 3 is a schematic perspective view illustrating a part of the configuration of the memory cell array 11. FIG. 3 is a drawing for describing a three-dimensional structure of the wiring, the memory cells MC, and similar part. Then, the interlayer insulating films provided between such as the wirings are not illustrated. FIG. 3 is a drawing for an explanation. Then, the specific configuration may be changed as necessary.

As illustrated in FIG. 3, the memory cell array 11 is, for example, what is called a cross-point type memory cell array. That is, in the memory cell array 11, a plurality of bit lines BL arranged in an X direction, provided in parallel and extending in a Y direction is provided. Above the plurality of bit lines BL, a plurality of word lines WL arranged in the Y direction, provided in parallel and extending in the X direction is provided. Furthermore, at the intersecting portions between the plurality of bit lines BL and the plurality of word lines WL, the respective memory cells MC are provided.

[Memory Cell MC]

Figure 4:
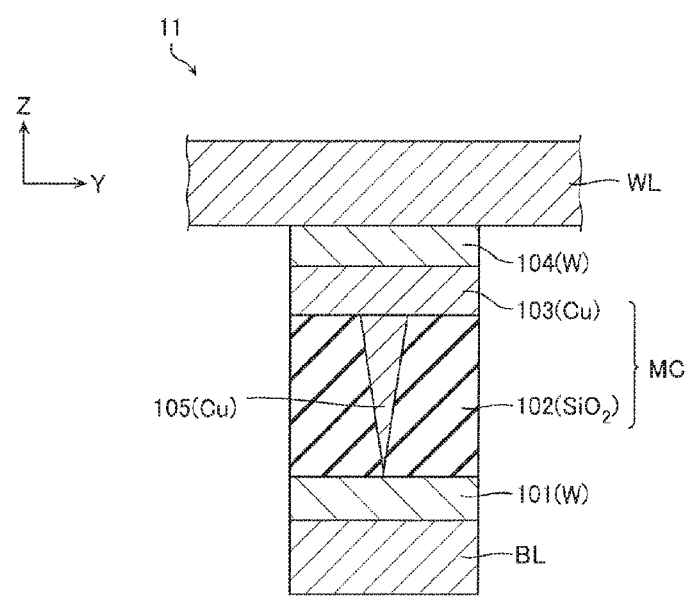
FIG. 4 is a cross-sectional view illustrating a configuration of a memory cell of the semiconductor memory device.

FIG. 4 is a cross-sectional view illustrating a configuration of a part of the memory cell MC. In FIG. 4, interlayer insulating films provided between the likes of the wirings or the like are not illustrated.

The memory cell MC is provided between a lower electrode 101 (cathode, the first electrode) connected to the bit line BL and an upper electrode 104 (anode, the second electrode) connected to the word line WL. The memory cell MC includes a resistance change film 102 provided between the lower electrode 101 and the upper electrode 104, and a metal film 103 provided between this resistance change film 102 and the upper electrode 104. In the memory cell MC, a conductive filament 105 is formed. The memory cell MC may be in two types of resistive states: a low resistance state and a high resistance state. In the low resistance state, the filament 105 is formed within the resistance change film 102 so as to penetrate the resistance change film 102. This filament 105 becomes a current path. In the high resistance state, the filament 105 is separated or disappears within the resistance change film 102, and the current path is not constituted.

The lower electrode 101 is formed of a conductive film, for example, tungsten (W). The lower electrode 101 is provided on a top surface of the bit line BL and serves as a cathode of the memory cell MC. The resistance change film 102 is formed of, for example, oxide such as silicon oxide ($SiO_2$) or alumina ($Al_2O_3$), or nitride such as silicon nitride ($Si_3N_4$). The metal film 103 is constituted of, for example, metal such as copper (Cu) or silver (Ag), or compound including one or more types of metallic element. As an example, the metal film 103 is described to be copper in the first embodiment. The metal film 103 supplies metal ions, which constitute the filament 105, into the resistance change film 102.

The upper electrode 104 is formed of a conductive film, for example, tungsten (W). The upper electrode 104 is provided between the word line WL and the resistance change film 102 and serves as an anode of the memory cell MC. The filament 105 is made of metal ions such as copper ions ($Cu^+$) or silver ions ($Ag^{2+}$) supplied into the resistance change film 102 from the metal film 103.

Figure 5:
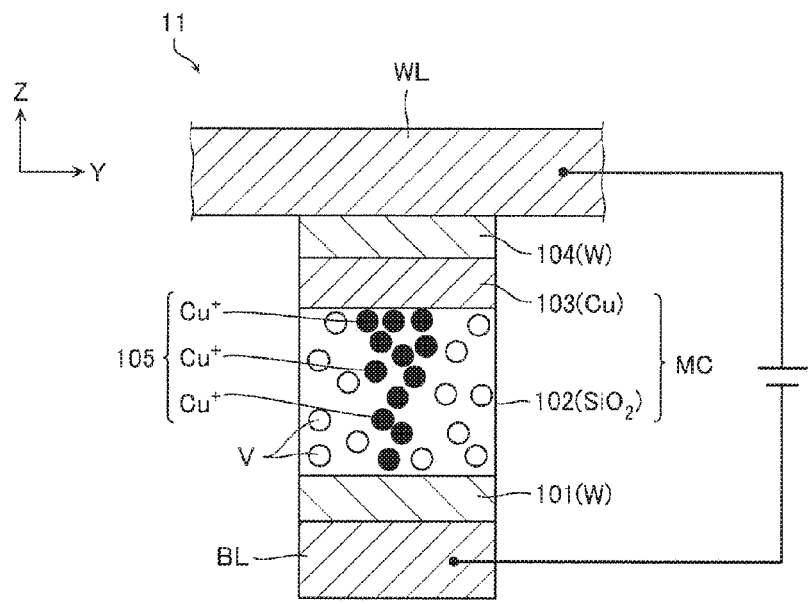
FIG. 5 is a schematic diagram for describing a set operation of the semiconductor memory device.

FIG. 5 is a schematic diagram for describing a set operation that performs transition of the memory cell MC from the high resistance state to the low resistance state. In the set operation, a voltage of a polarity in which the upper electrode 104 has a higher potential and the lower electrode 101 has a lower potential (hereinafter referred to as a "positive polarity" or a "first polarity") is applied. This causes the copper included in the metal film 103 to become positive ions to move toward the lower electrode 101, which is a negative electrode. In this respect, the copper ions $Cu^+$ diffuse to the lower electrode 101 through vacancies V within the resistance change film 102. Then, the copper ions $Cu^+$ combines with silicon atoms, oxygen atoms, or similar atoms within the resistance change film 102 to form the filament 105 within the resistance change film 102. This constitutes the current path between the upper electrode 104 and the lower electrode 101, and the memory cell MC becomes in the low resistance state.

The vacancy V within the resistance change film 102 is a point defect, which occurs when a lattice of a material that constitutes the resistance change film 102 is destroyed, for example, due to an application of electric field to the resistance change film 102. The copper ion $Cu^+$ has a large atomic size, therefore a barrier is high when moving between the lattices constituting the resistance change film 102. In view of this, the copper ion $Cu^+$ needs electrically high energy to move between the lattices. Here, if the vacancy V and a crystal defect are present at the proximity of the copper ion $Cu^+$, the copper ion $Cu^+$ is allowed to move through the vacancy V, thus lowering the barrier between the lattices. In view of this, the diffusion speed of the copper ion $Cu^+$ depends on the vacancy concentration. That is, by increasing the vacancy concentration, the diffusion of the copper ions Cu⁺ with a low electrical energy supply is achieved.

Figure 6:
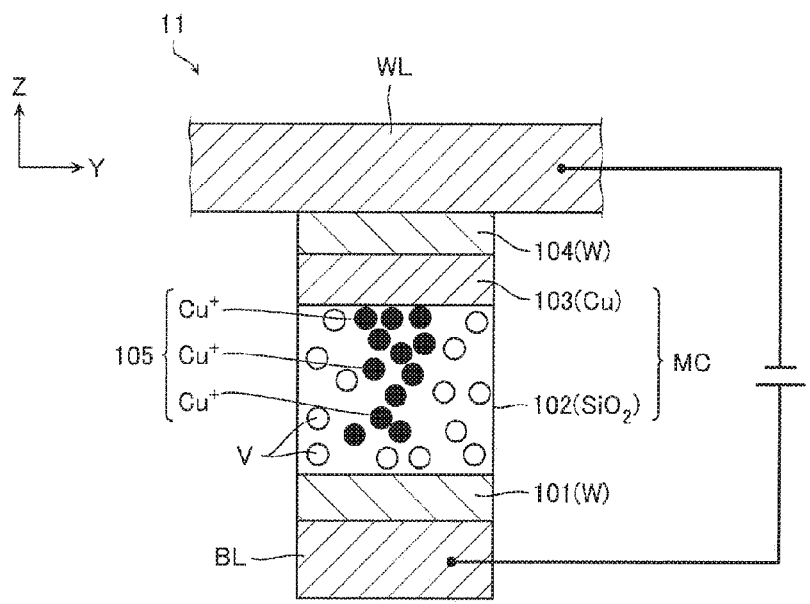
FIG. 6 is a schematic diagram for describing a reset operation of the semiconductor memory device.

FIG. 6 is a schematic diagram for describing a reset operation that performs transition of the memory cell MC from the low resistance state to the high resistance state. In the reset operation, a voltage of an inverse polarity of the first polarity in which the lower electrode 101 has a higher potential and the upper electrode 104 has a lower potential (hereinafter referred to as a "negative polarity" or a "second polarity") is applied. This causes the copper included in the filament 105 to become positive ions to move toward the upper electrode 104, which is a negative electrode. In this respect, the copper ions Cu⁺ diffuse in a direction going away from the lower electrode 101 through vacancies V within the resistance change film 102. This causes the filament 105 of the resistance change film 102 to be separated or disappear, and the current path disappears. Thus, the memory cell MC becomes the high resistance state.

[Set Operation]

Figure 7:
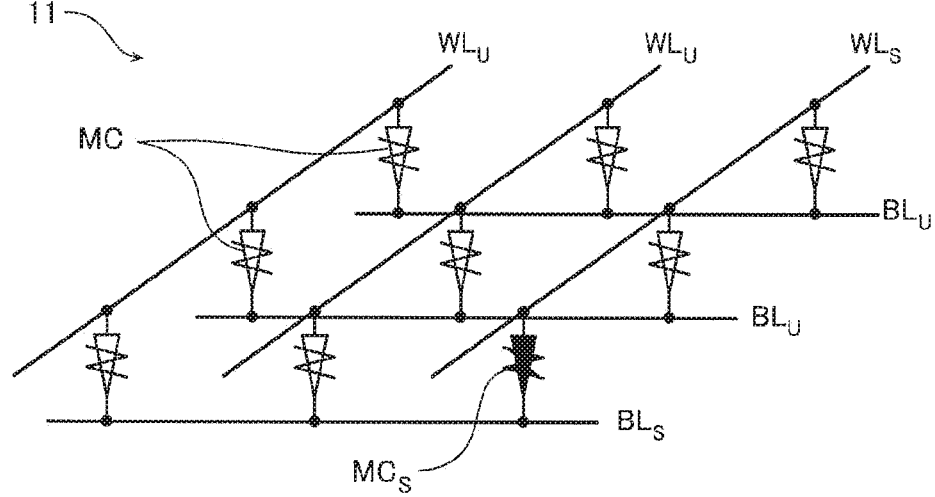
FIG. 7 is a circuit diagram for describing the set operation of the semiconductor memory device.

FIG. 7 is a circuit diagram for describing the set operation according to the embodiment. The following describes a case performing the set operation for a selected memory cell $MC_S$ connected to a selected bit line $BL_S$ and a selected word line $WL_S$.

Figure 8:
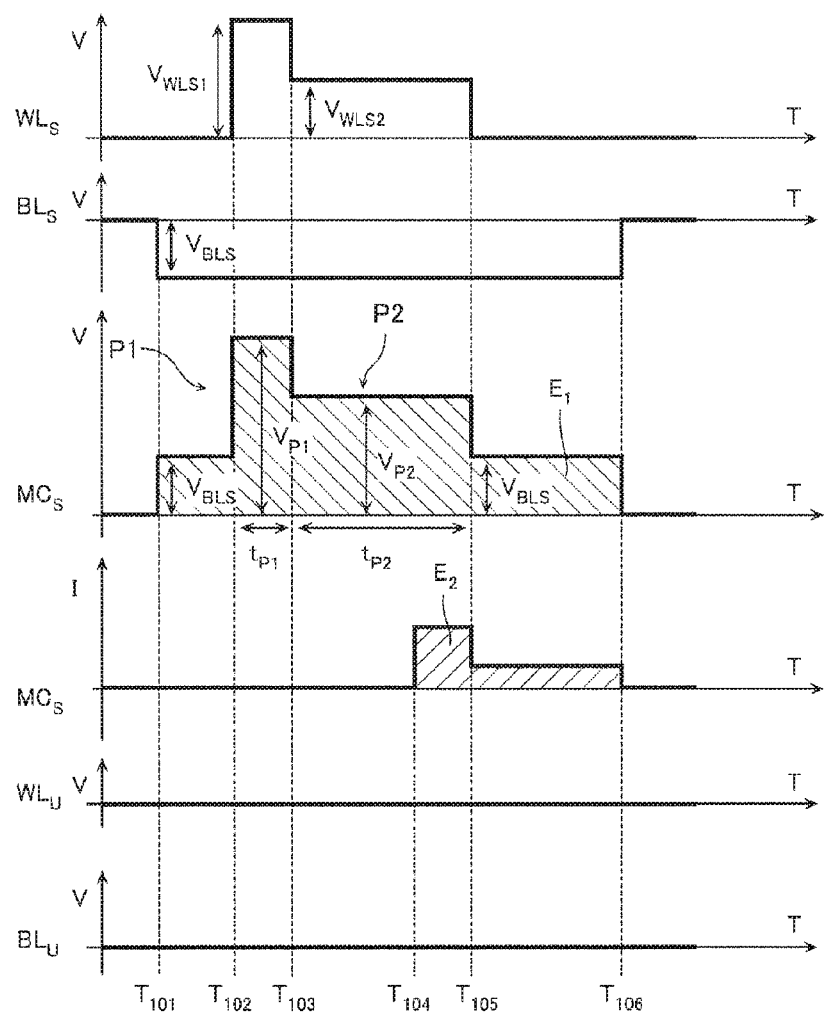
FIG. 8 is a timing diagram for describing the set operation.

FIG. 8 is a timing diagram for describing the set operation according to the embodiment. FIG. 8 illustrates voltages applied to the selected word line $WL_S$ and the selected bit line $BL_S$, a voltage and a current of the selected memory cell $MC_S$, and voltages applied to a non-selected word line $WL_U$ and a non-selected bit line $BL_U$.

Figure 10:
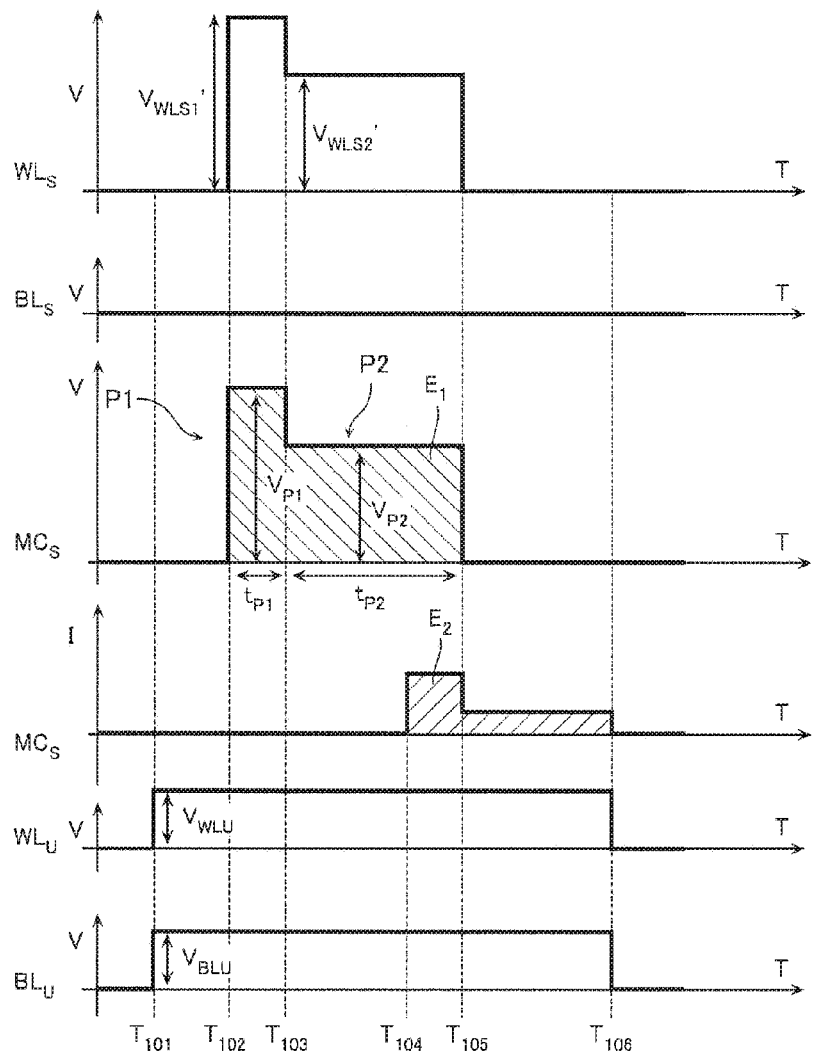
FIG. 10 is a timing diagram for describing a set operation according to a modification of a first embodiment.

At Timing $T_{101}$, a selected bit line voltage $V_{BLS}$ (a fifth voltage) is applied to the selected bit line $BL_S$. The selected bit line voltage $V_{BLS}$ is, for example, a voltage of the negative polarity, and has a magnitude to the extent where copper ions within a non-selected memory cell MC are almost unaffected. The selected bit line voltage $V_{BLS}$ may not be a voltage of the negative polarity, and, for example, may be set at around 0 V as illustrated in FIG. 10. As shown in FIG. 8, an intermediate potential between the selected bit line voltage $V_{BLS}$ and a selected word line voltage $V_{WLS2}$, which is described later, is applied to, for example, the selected word line $WL_S$, the non-selected word line $WL_U$, and the non-selected bit line $BL_U$. This applies a voltage of the positive polarity $|V_{BLS}|$ to the selected memory cell $MC_S$.

At Timing $T_{102}$, a selected word line voltage $V_{WLS1}$ (a first voltage) is applied to the selected word line $WL_S$. The selected word line voltage $V_{WLS1}$ is a voltage of the positive polarity, and has, for example, a magnitude to the extent where the copper ions within the non-selected memory cell MC are almost unaffected. This applies a first pulse P1 to the selected memory cell $MC_S$.

The first pulse P1 has a voltage of the positive polarity $V_{P1}$ with a magnitude to the extent where copper ions and oxygen ions within the selected memory cell $MC_S$ are movable. Therefore, in the selected memory cell $MC_S$, the vacancies V are pulled to the proximity of the lower electrode 101, thus increasing a concentration of the vacancies V at the proximity of the lower electrode 101. The first pulse P1 has a pulse width (an application time of the voltage) $t_{P1}$ to the extent where the oxygen ions within the selected memory cell $MC_S$ are movable. However, a period between Timing $T_{102}$ and Timing $T_{103}$ is a period insufficient for moving the copper ions Cu⁺ to form the filament 105. Thus, the selected memory cell $MC_S$ does not transition to the low resistance state.

At Timing $T_{103}$, the voltage of the selected word line $WL_S$ is decreased from the selected word line voltage $V_{WLS1}$ (a first voltage) to a selected word line voltage $V_{WLS2}$ (a second voltage). The selected word line voltage $V_{WLS2}$ is a voltage of the positive polarity, and smaller than the selected word line voltage $V_{WLS1}$. This applies a second pulse P2 to the selected memory cell $MC_S$. The second pulse P2 has a voltage of the positive polarity $V_{P2}$ with a magnitude to the extent where the copper ions Cu⁺ within the selected memory cell $MC_S$ are movable. Therefore, the copper ions Cu⁺ within the selected memory cell $MC_S$ approach the lower electrode 101 through the vacancies V. The voltage $V_{P2}$ of the second pulse P2 is smaller than the voltage $V_{P1}$ of the first pulse P1. The second pulse P2 has a pulse width (an application time of the voltage) $t_{P2}$ to the extent where the copper ions Cu⁺ within the selected memory cell $MC_S$ are movable. The pulse width $t_{P2}$ of the second pulse P2 is longer than the pulse width $t_{P1}$ of the first pulse P1. In other words, the period $t_{P1}$ of applying the first pulse P1 to the selected memory cell $MC_S$ is shorter than the period $t_{P2}$ of applying the second pulse P2.

At Timing $T_{104}$, the selected memory cell $MC_S$ becomes in the low resistance state, and the current starts flowing through the selected memory cell $MC_S$.

At Timing $T_{105}$, the voltage of the selected word line $WL_S$ is set to 0 V. In other words, applying the selected word line voltage $V_{WLS2}$ is terminated. This decreases the voltage applied to the selected memory cell $MC_S$ to $|V_{BLS}|$.

At Timing $T_{106}$, the voltage of the selected bit line $BL_S$ is set to 0 V. In other words, applying the selected bit line voltage $V_{BLS}$ is terminated. This makes the voltage applied to the selected memory cell $MC_S$ 0 V.

[Effect]

Applying a large voltage or applying the voltage for a long time to the memory cell MC applies large stress to the memory cell MC to accelerate the deterioration of the memory cell MC. The magnitude of the stress applied to the memory cell MC is indicated by, for example, a magnitude of an integral value of the voltage by time $E_1$ (FIG. 8) or an integral value of the current by time $E_2$ (FIG. 8).

In order to decrease the stress of the memory cell MC, it is only necessary to decrease the voltage applied to the memory cell MC or to shorten the application time of the voltage. However, in order to move the copper ions Cu⁺ within the memory cell MC, it is necessary to apply a certain magnitude of voltage or to apply the voltage for a certain period.

Here, as described with reference to FIG. 5, the copper ions Cu⁺ repeatedly diffuse through the vacancies V within the resistance change film 102. In this respect, the existence of the vacancies V or the crystal defects at the proximity of the copper ions Cu⁺ allows the copper ions Cu⁺ to move through the vacancies V, thus lowering the barrier between the lattices. Diffusion of the copper ions Cu⁺ through the vacancies V requires existence of the vacancies V at adjacent lattice positions. In view of this, the diffusion speed of the copper ion Cu⁺ depends on the vacancy concentration. Furthermore, the barrier between the lattices is low in diffusion through the vacancies V. Accordingly, a lower electrical energy supply diffuses Cu⁺ ions. Therefore, by increasing the concentration of the vacancies V at the proximity of the lower electrode 101, the voltage value and the pulse width to move the copper ions Cu⁺ can be decreased.

Then, as described with reference to FIG. 8, in the set operation according to the embodiment, the first pulse P1 and the second pulse P2 are continuously applied to the selected memory cell $MC_S$. The first pulse P1 has the voltage $V_{P1}$ to the extent where oxygen ions within the memory cell MC are movable. Accordingly, applying the first pulse P1 breaks the lattices constituting the resistance change film 102. This generates the vacancies V due to, for example, the point defects. That is, many lattices constituting the resistance change film 102 are broken by applying a high voltage to the resistance change film 102, and the concentration of the vacancies V can be increased. Additionally, by applying the first pulse P1 and the second pulse P2 continuously, it is possible to move the copper ions $Cu^+$ before the vacancies V diffuse from the proximity of the lower electrode 101.

Figure 9:
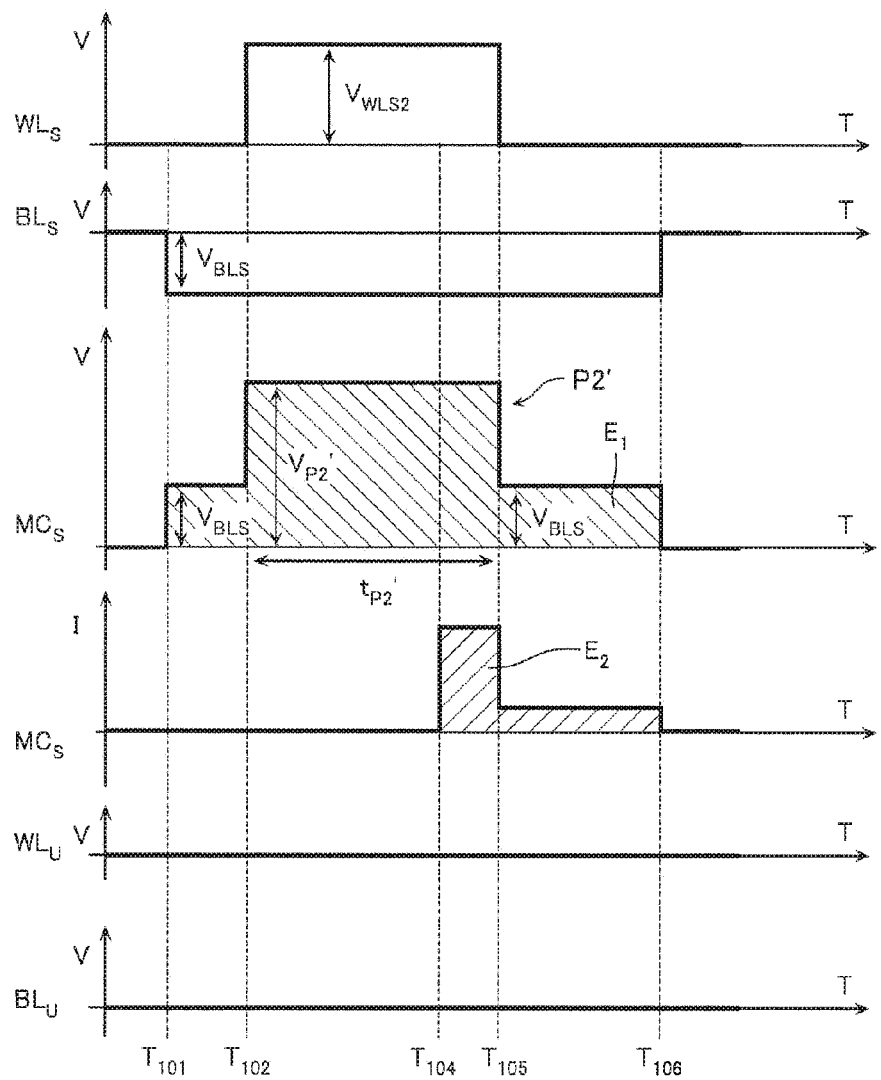
FIG. 9 is a timing diagram for describing a set operation according to a comparative example.

By such kind of method, compared with, for example, as illustrated in FIG. 9, a case where applying a pulse P2' having a certain voltage $V_{P2}'$ and a pulse width $t_{P2}'$ to the selected memory cell $MC_S$ in the set operation, by decreasing the voltage $V_{P2}$ of the second pulse P2 or the shorten the pulse width $t_{P2}$, the integral value of the voltage by time $E_1$ can be decreased. According to the embodiment, the voltage applied to the selected memory cell $MC_S$ immediately after the selected memory cell $MC_S$ transitions to the low resistance state is small compare with, for example, that according to the method in FIG. 9. Therefore, this can decrease the integral value of the current by time $E_2$. Therefore, this can decrease the stress of the memory cell MC.

The oxygen atoms within the resistance change film 102 are strongly bound together the silicon atoms by a covalent bond. Therefore, forming the vacancies V by moving the oxygen atoms requires a high voltage. In view of this, the voltage $V_{P1}$ of the first pulse P1 is larger than the voltage $V_{P2}$ of the second pulse P2. The voltage $V_{P1}$ of the first pulse P1 may be set to, for example, 1.5 times or more of the voltage $V_{P2}$ of the second pulse P2.

In order to decrease the stress of memory cell MC, the pulse width $t_{P1}$ (FIG. 8) of the first pulse P1 is preferred to be fully short. The pulse width $t_{P1}$ of the first pulse P1 may be set to, for example, quarter or less of the pulse width $t_{P2}$ of the second pulse P2.

In an example illustrated in FIG. 8, the voltage of the negative polarity is applied to the selected bit line $BL_S$, and 0 V is applied to the non-selected word line $WL_U$ and the non-selected bit line $BL_U$. However, for example, as illustrated in FIG. 10, the voltage with 0 V may be applied to the selected bit line $BL_S$, and the voltages of the positive polarity $V_{WLU}$ and $V_{BLU}$ may be applied to the non-selected word line $WL_U$ and the non-selected bit line $BL_U$ respectively. In this case, a selected word line voltage $V_{WLS1}'$ (a first voltage) may correspond to the voltage $V_{P1}$ of the first pulse P1. A selected word line voltage $V_{WLS2}'$ (a second voltage) may correspond to the voltage $V_{P2}$ of the second pulse P2.

Second Embodiment

Figure 11:
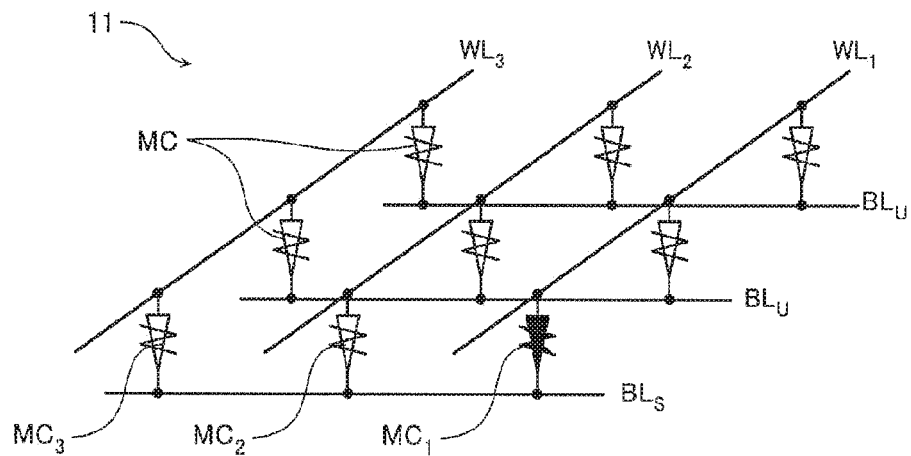
FIG. 11 is a circuit diagram for describing a set operation according to a second embodiment.

FIG. 11 is a circuit diagram for describing a set operation according to a second embodiment. Like reference numerals designate corresponding or identical elements to those of the first embodiment, and therefore such elements will not be further elaborated here.

According to the first embodiment, one set operation performs transition of one selected memory cell $MC_S$ to the low resistance state. In contrast, according to the second embodiment, one set operation performs transitions of a plurality of memory cells MC to the low resistance state. The following describes a case performing sequentially transitions of the selected bit line $BL_S$, and memory cells $MC_1$, $MC_2$, and $MC_3$ connected to word lines $WL_1$, $WL_2$, and $WL_3$ respectively to the low resistance state.

Figure 12:
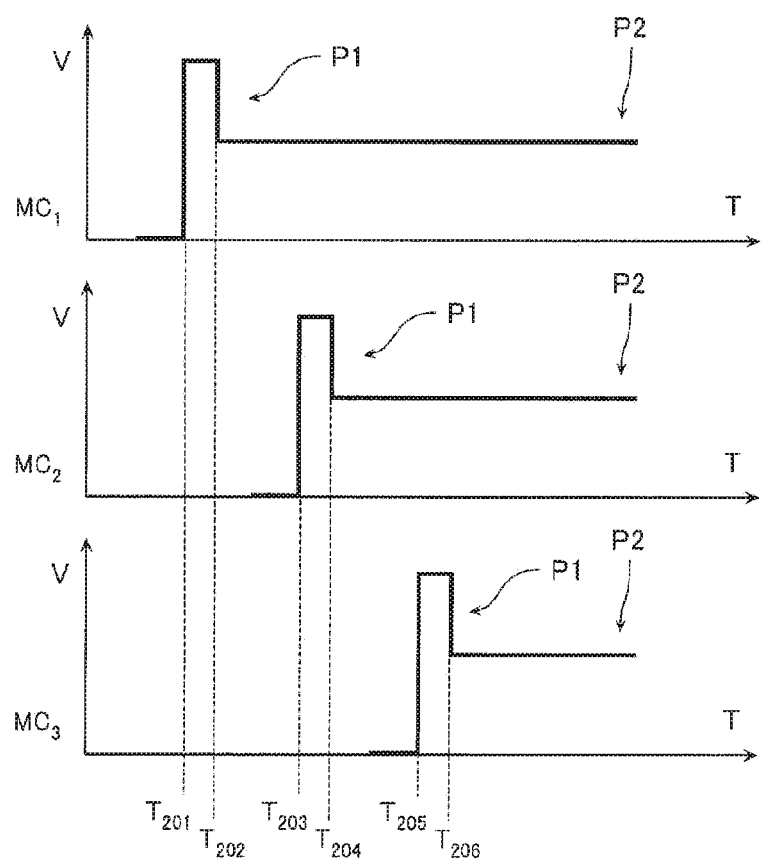
FIG. 12 is a timing diagram for describing the set operation.

FIG. 12 is a timing diagram for describing the set operation according to the embodiment. FIG. 12 illustrates voltages applied to the memory cells $MC_1$, $MC_2$, and $MC_3$.

At Timing $T_{201}$, the first pulse P1 is applied to the memory cell $MC_1$.

At Timing $T_{202}$, applying the first pulse P1 to the memory cell $MC_1$ terminates, and applying the second pulse P2 starts.

At Timing $T_{203}$, the first pulse P1 is applied to the memory cell $MC_2$ in a state where the second pulse P2 is applied to the memory cell $MC_1$.

At Timing $T_{204}$, applying the first pulse P1 to the memory cell $MC_2$ terminates, and applying the second pulse P2 starts.

At Timing $T_{205}$, the first pulse P1 is applied to the memory cell $MC_3$ in a state where the second pulse P2 is applied to the memory cell $MC_1$ and the memory cell $MC_2$.

At Timing $T_{206}$, applying the first pulse P1 to the memory cell $MC_3$ terminates, and applying the second pulse P2 starts.

According to the embodiment, by performing the set operations for the plurality of memory cells MC in parallel, it is possible to perform writing of the user data at high speed. Additionally, by shifting timing of applying the first pulse P1 having comparatively a large voltage value, it is possible to perform the set operation stably.

According to the embodiment, for example, applying the first pulse P1 to the memory cell $MC_2$ starts after applying the first pulse P1 to the memory cell $MC_1$ has terminated. However, termination of applying the first pulse P1 to the memory cell $MC_1$ and start of applying the first pulse P1 to the memory cell $MC_2$ may be simultaneous.

Third Embodiment

Figure 13:
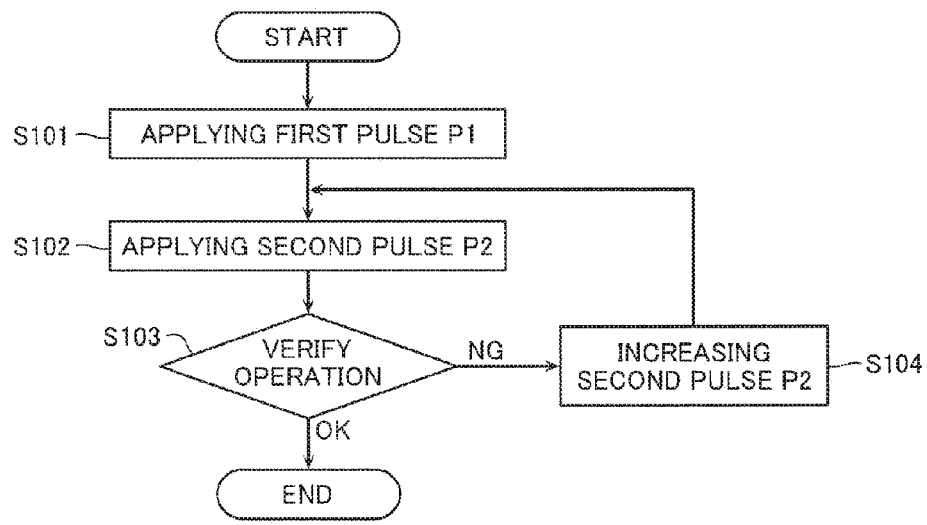
FIG. 13 is a flowchart for describing a set operation according to a third embodiment.
Figure 14:
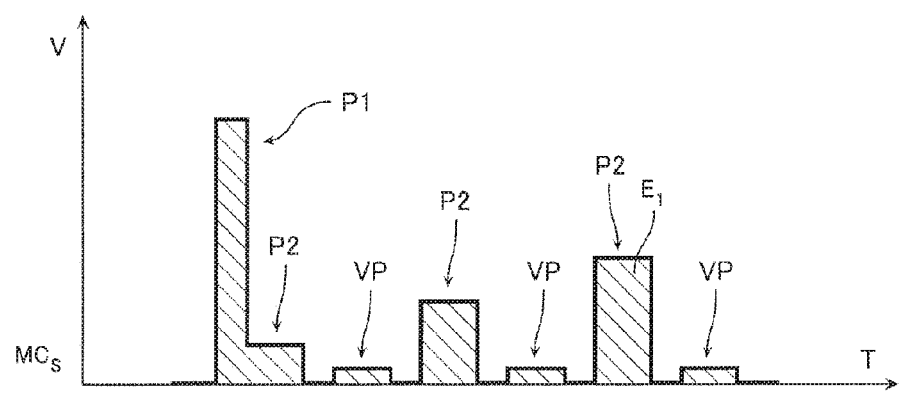
FIG. 14 is a timing diagram for describing the set operation.

FIG. 13 is a flowchart for describing a set operation according to a third embodiment. FIG. 14 is a timing diagram for describing the set operation. Like reference numerals designate corresponding or identical elements to those of the first embodiment, and therefore such elements will not be further elaborated here.

As described with reference to FIG. 8, according to the first embodiment, one set operation applies the second pulse P2 to the selected memory cell $MC_S$ only once. In contrast, according to the third embodiment, as illustrated in FIG. 13 and FIG. 14, while increasing the voltage of the second pulse P2, the second pulse P2 is applied to the selected memory cell $MC_S$ several times. Every time applying the second pulse P2 terminates, a verify operation that confirms whether or not the selected memory cell $MC_S$ has becomes in a desired state is performed. In the example illustrated in FIG. 8, the desired state is the low resistance state.

At Step S101, in a mode similar to that of the first embodiment, the first pulse P1 is applied to the selected memory cell $MC_S$.

At Step S102, the second pulse P2 is applied to the selected memory cell $MC_S$.

At Step S103, the verify operation is performed. In the verify operation, as illustrated in FIG. 14, a verify pulse VP is applied to the selected memory cell $MC_S$ to confirm whether or not the selected memory cell $MC_S$ has transitioned to the low resistance state. The verify pulse VP has a voltage of the positive polarity having a magnitude to the extent where the copper ions within the memory cell MC are almost unaffected. The voltage of the verify pulse VP is smaller than the voltage of the second pulse P2. As illustrated in FIG. 13, at Step S103, when the memory cell MC has not transitioned to the low resistance state, Step S104 is performed. When the memory cell MC has transitioned to the low resistance state, the set operation terminates.

At Step S104, the voltage of the second pulse P2 is increased. After performing Step S104, Step S102 and Step S103 are repeatedly performed. Accordingly, as illustrated in FIG. 14, the voltage of the second pulse P2 is increased.

The embodiment, while performing the verify operation (Step S103), causes the voltage of the second pulse P2 to increase. When the memory cell MC has transitioned to the low resistance state, applying the voltage terminates. As illustrated in FIG. 14, in such mode, the integral value of the voltage by time $E_1$ is further decreased and the stress of the memory cell MC can be decreased.

Figure 15:
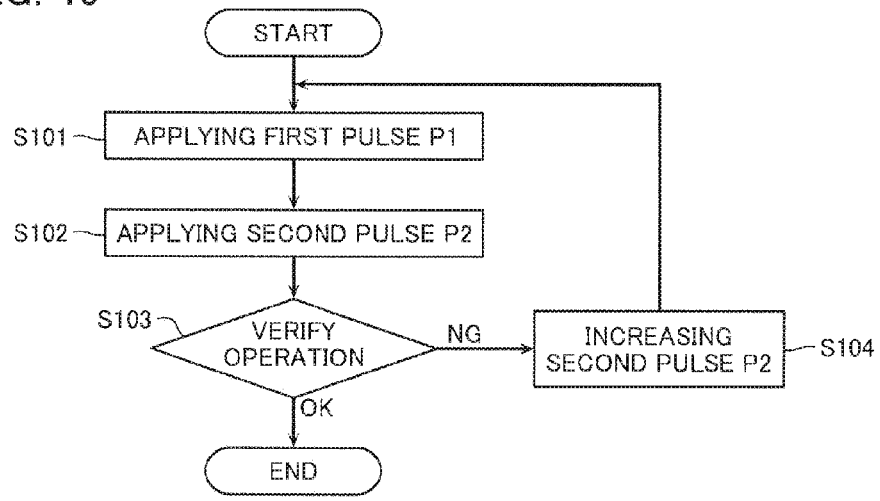
FIG. 15 is a flowchart for describing a set operation according to a modification of a third embodiment.
Figure 16:
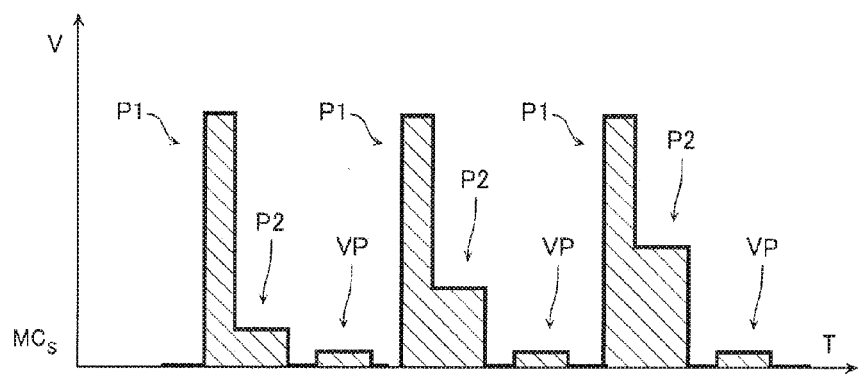
FIG. 16 is a timing diagram for describing the set operation.
Figure 17:
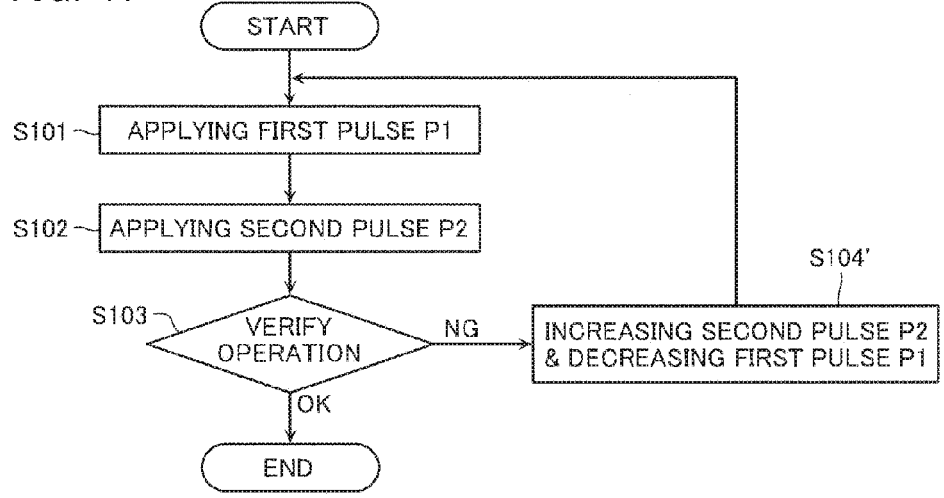
FIG. 17 is a flowchart for describing a set operation according to a modification of the third embodiment.
Figure 18:
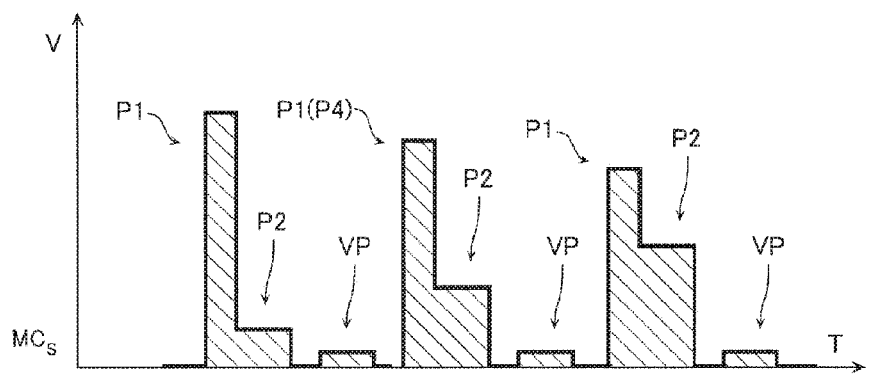
FIG. 18 is a timing diagram for describing the set operation.
Figure 19:
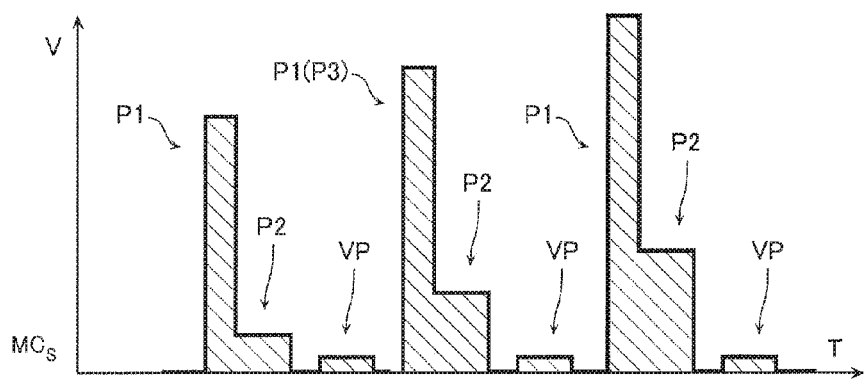
FIG. 19 is a timing diagram for describing another example of the set operation.

Note that, according to the embodiment, the first pulse P1 is applied only once. However, for example, as illustrated in FIG. 15 and FIG. 16, Step S101, Step S102, and Step S103 all may be repeated after increasing the voltage of the second pulse P2 at Step S104. Additionally, as illustrated in FIG. 17 and FIG. 18, while increasing the voltage of the second pulse P2, the voltage of the first pulse P1 may be decreased (Step S104'). The first pulse P1 having the thus decreased voltage value is sometimes referred to as a fourth pulse P4. Additionally, as illustrated in FIG. 19, the voltage of the first pulse P1 may be increased. The first pulse P1 having the thus amplified voltage value is sometimes referred to as a third pulse P3.

Fourth Embodiment

Figure 20:
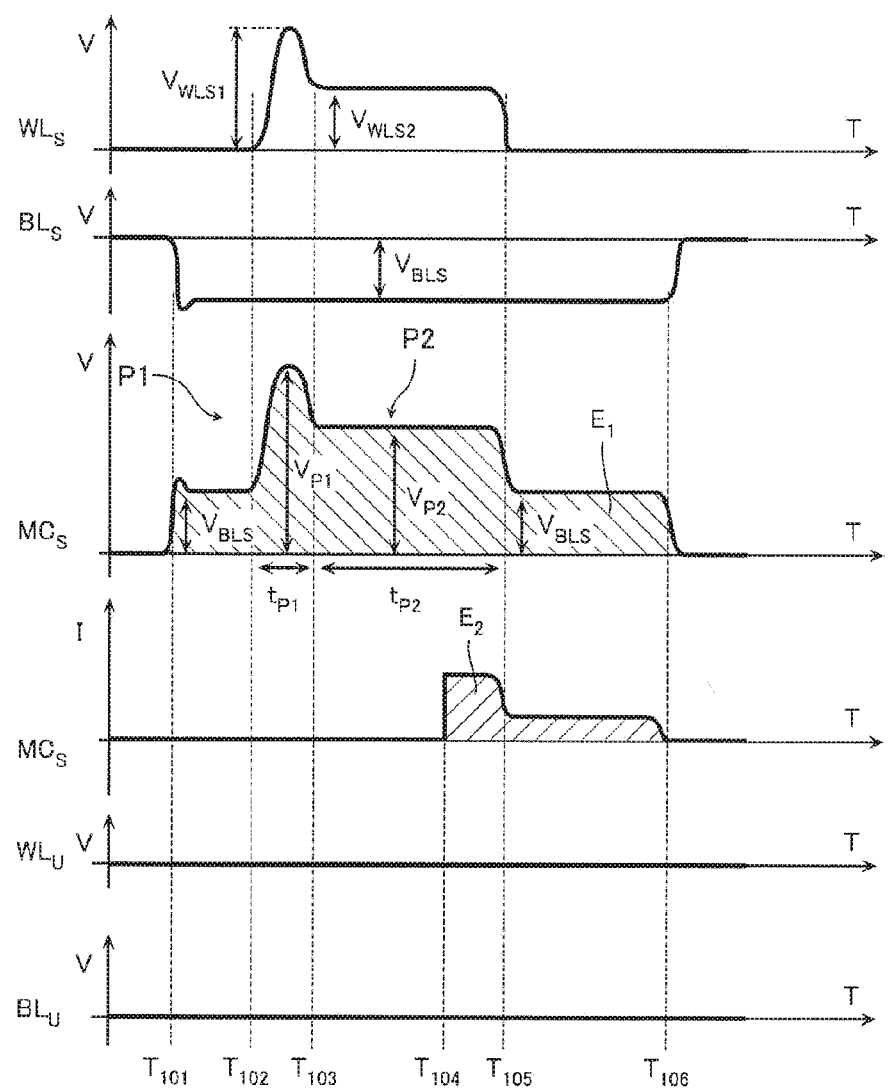
FIG. 20 is a timing diagram for describing a set operation according to a fourth embodiment.

FIG. 20 is a timing diagram for describing a set operation according to a fourth embodiment. Like reference numerals designate corresponding or identical elements to those of the first embodiment, and therefore such elements will not be further elaborated here.

According to the embodiment, the first pulse P1 is achieved by a surge pulse. That is, according to the embodiment, the voltage of the selected word line $WL_S$ transitionally reaches a selected word line voltage $V_{WLS1}$ (a first voltage) between Timing $T_{102}$ and Timing $T_{103}$, and converges to a selected word line voltage $V_{WLS2}$ (a second voltage) at Timing $T_{103}$. Such set operation can be achieved by using an existing control circuit.

According to the embodiment, a surge voltage (a transitional voltage) in the set operation of the selected word line $WL_S$ (the upper electrode 104 of the selected memory cell $MC_S$) may be larger than a surge voltage of another wiring, for example, the selected bit line $BL_S$ (the lower electrode 101 of the selected memory cell $MC_S$). For example, as described with reference to FIG. 10, when the voltage with 0 V is applied to the selected bit line $BL_S$, and the voltages of the positive polarity $V_{WLU}$ and $V_{BLU}$ are applied to the non-selected word line $WL_U$ and the non-selected bit line $BL_U$ respectively, the surge voltage in the set operation of the selected word line $WL_S$ may be larger than a surge voltage at another wiring, for example, the non-selected word line $WL_U$ or the non-selected bit line $BL_U$.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first electrode;
   a second electrode;
   a memory cell provided between the first electrode and the second electrode, the memory cell including a resistance change film; and
   a control circuit that applies a voltage between the first electrode and the second electrode to perform transition of a resistive state of the memory cell, wherein
   in a first writing, the control circuit:
   applies a first voltage of a first polarity to the first electrode;
   applies a second voltage of a second polarity opposite from the first polarity to the second electrode; and
   after the first voltage is applied to the first electrode, continuously applies a third voltage of the first polarity smaller than the first voltage to the first electrode while the second voltage is applied to the second electrode.

2. The semiconductor memory device according to claim 1, wherein
   the first voltage is a transitional voltage, and
   a voltage applied to the first electrode decreases from the first voltage to the third voltage.

3. The semiconductor memory device according to claim 1, wherein
   in the first writing, a voltage applied to the first electrode transitionally decreases from the first voltage to the third voltage.

4. The semiconductor memory device according to claim 1, wherein
   a voltage applied to the first electrode converges from the first voltage to the third voltage.

5. The semiconductor memory device according to claim 1, wherein
   a period in which the first voltage is applied to the first electrode is shorter than a period in which the third voltage is applied to the first electrode.

6. The semiconductor memory device according to claim 1, wherein
   in the first writing, a transitional voltage applied to the first electrode is larger than a transitional voltage applied to the second electrode.

7. The semiconductor memory device according to claim 1, wherein
   the second polarity is opposite from the first polarity, and
   in the first writing, the control circuit:
   changes a voltage of the first electrode from a ground voltage to the first voltage; and
   changes a voltage of the second electrode from the ground voltage to the second voltage.

8. The semiconductor memory device according to claim 1, wherein
   the first voltage, the second voltage and the third voltage are not less than a ground voltage.

9. The semiconductor memory device according to claim 1, wherein
   after the third voltage is applied to the first electrode, the control circuit changes a voltage of the first electrode from the third voltage to a ground voltage while the second voltage is applied to the second electrode.

10. A semiconductor memory device comprising:
a first electrode;
a second electrode;
a memory cell provided between the first electrode and the second electrode, the memory cell including a resistance change film; and
a control circuit that applies a voltage between the first electrode and the second electrode to perform transition of a resistive state of the memory cell, wherein
in a first writing, the control circuit applies a voltage of a first polarity to the first electrode and a voltage of a second polarity opposite from the first polarity to the second electrode, and
a first potential difference between the first electrode and the second electrode at a first timing is larger than a second potential difference between the first electrode and the second electrode at a second timing after the first timing.

11. The semiconductor memory device according to claim 10, wherein
a potential difference between the first electrode and the second electrode continuously decreases from the first potential difference to the second potential difference.

12. The semiconductor memory device according to claim 10, wherein
a voltage applied to the first electrode converges from a voltage applied at the first timing to a voltage applied at the second timing.

13. The semiconductor memory device according to claim 10, wherein
a constant voltage is applied to the second electrode.

14. The semiconductor memory device according to claim 10, wherein
a constant voltage is applied to the second electrode in a period between the first timing and the second timing.

15. A semiconductor memory device comprising:
a first electrode;
a second electrode;
a memory cell provided between the first electrode and the second electrode, the memory cell including a resistance change film; and
a control circuit that applies a voltage between the first electrode and the second electrode to perform transition of a resistive state of the memory cell, wherein
in a first writing, the control circuit, while a first voltage of a first polarity is applied to the second electrode, applies a second voltage of a second polarity opposite from the first polarity to the first electrode in a first period, and, continuously applies a third voltage of the second polarity smaller than the second voltage to the first electrode in a second period longer than the first period.

16. The semiconductor memory device according to claim 15, wherein
the control circuit, after the third voltage is applied to the first electrode, while a voltage of the first electrode is a ground voltage, applies the first voltage to the second electrode in a third period.

17. The semiconductor memory device according to claim 15, wherein
a first voltage difference between the first voltage and the second voltage is larger than a second voltage difference between the first voltage and the third voltage.

18. The semiconductor memory device according to claim 15, wherein
the second voltage is a transitional voltage, and
a voltage applied to the first electrode converges from the second voltage to the third voltage.

\* \* \* \* \*